United States Patent

Carre et al.

Patent Number: 5,853,446
Date of Patent: Dec. 29, 1998

[54] METHOD FOR FORMING GLASS RIB STRUCTURES

[75] Inventors: Alain R.E. Carre, Le Chatelet-En-Brie; Bernard Eid, LaGrande-Paroisse, both of France; Mark S. Friske, Campbell, N.Y.; Ronald E. Johnson, Tioga, Pa.; Candace J. Quinn, Corning; Frances M. Smith, Elmira, both of N.Y.; Jean-Pierre Themont, Montigny Sur Loing, France

[73] Assignee: Corning Incorporated, Corning, N.Y.

[21] Appl. No.: 820,206

[22] Filed: Mar. 18, 1997

Related U.S. Application Data

[60] Provisional application No. 60/015,511, Apr. 16, 1996.

[51] Int. Cl.⁶ .......... C03B 21/00; C03B 19/01; C03B 19/09; C03B 23/00

[52] U.S. Cl. .......... 65/17.3; 65/63; 427/303.5; 427/428

[58] Field of Search .......... 65/17.3, 63; 427/96, 427/383.5, 428

[56] References Cited

U.S. PATENT DOCUMENTS

| | | | |
|---|---|---|---|
| 2,889,952 | 6/1959 | Claypoole | 220/2.1 |
| 3,607,180 | 9/1971 | Merz et al. | 65/33 |
| 5,116,271 | 5/1992 | Arimoto | 445/24 |
| 5,127,330 | 7/1992 | Okazaki et al. | 101/450.1 |
| 5,366,760 | 11/1994 | Fujii et al. | 427/96 |
| 5,670,843 | 9/1997 | Matsuura | 313/582 |
| 5,674,634 | 10/1997 | Wang et al. | 428/688 |
| 5,684,361 | 11/1997 | Seki | 313/582 |

FOREIGN PATENT DOCUMENTS

| | | |
|---|---|---|
| 0 452 118 A1 | 10/1991 | European Pat. Off. . |
| 4-342204 | 11/1992 | Japan . |
| 5-147359 | 6/1993 | Japan . |
| 6-287027 | 10/1994 | Japan . |

*Primary Examiner*—Peter Chin
*Assistant Examiner*—Jacqueline A. Ruller
*Attorney, Agent, or Firm*—Robert L. Carlson

[57] ABSTRACT

A method and apparatus for making formed glass structures. A glass frit containing material is deposited within a recessed pattern, hardened in the recessed pattern, and transferred to a substrate. The method and apparatus of the invention are particularly useful for forming barrier rib structures for use in plasma display panels.

28 Claims, 4 Drawing Sheets

METHOD FOR FORMING GLASS RIB STRUCTURES

This application claims the benefit of U.S. Provisional application Ser. No. 60/015,511, filed Apr. 16, 1996.

FIELD OF THE INVENTION

The invention relates to methods for forming freestanding glass structures, in particular a method for forming glass rib barrier layers such as are used in plasma flat panel display applications.

BACKGROUND OF THE INVENTION

Color plasma display panels are promising for large size flat panel display applications.

AC plasma display panels typically involve two parallel glass substrates, called the front plate and the rear plate, respectively. These substrates are often covered, on the sides facing each other, with a dielectric layer, which itself may be covered by a MgO layer. A discharge gas mixture such as neon and xenon or neon with helium is hermetically sealed in the space defined by the two plates. Red, green and blue phosphors are located on the internal side of one of the two plates in a line or dot pattern. The displayed picture is produced by plasma discharges which are induced locally in the gas by applying a suitable voltage between electrodes which are selected in arrays buried in the dielectric layers. Ultraviolet light emitted locally by the gas discharge induces luminescence of the neighboring phosphors.

In order to prevent luminous cross-talk between neighboring pixels in such displays, barrier ribs are typically disposed vertically or as closed cells, on at least one of the substrates (typically the rear one) in order to optically insulate each discharge cell. The barrier rib structure is typically periodic with a pitch of from 200 $\mu$m to 400 $\mu$m, depending on the panel resolution. These ribs are about 30–80 $\mu$m wide and 100–200 $\mu$m thick. Alternatively, a closed cell design has been employed having square cells which are about 200–400 $\mu$m on each side. The "ribs" which form these square cells are about 30 $\mu$m to 70 $\mu$m wide and about 30 to 200 $\mu$m high.

These ribs are typically formed either by sandblasting or screen printing glass frits. Such screen printing methods involve several printing and drying steps, in which thin layers of glass frits are deposited on top of one another until the desired thickness rib is achieved. Sandblasting requires a masking step, and produces a great deal of particulate glass material.

It would be desirable to develop a method for forming such barrier ribs which employs less manufacturing steps and is uncomplicated and yet is still capable of forming accurate barrier rib structures.

SUMMARY OF THE INVENTION

The present invention relates to a method and apparatus for forming free standing glass structures such as, for example, glass barrier ribs which are used in electronic information display panel applications, such as plasma emissive or field emission displays. In one embodiment of the invention, a recessed pattern, such as an intaglio plate, corresponding to a desired freestanding glass structure (e.g. a glass barrier rib pattern for a plasma emissive display) is contacted with a formable glass frit containing material to form the free standing glass structure on a suitable substrate. This may be accomplished by a variety of methods. For example, in one embodiment, an Intaglio plate is filled with a glass frit containing material and the glass frit containing material is transferred to a substrate. In another embodiment, a coating of glass frit containing material first deposited onto a substrate, after which it is embossed by an Intaglio plate. By Intaglio plate, it is meant that the plate can be a flat plate or a cylindrical plate.

Glass frit containing materials, as used herein, means a material containing glass in particulate form such as, for example, an organic carrier medium in which is dispersed one or more particulate glasses. Typically, these glasses are contained in particle sizes less than 20 microns, preferably less than 12 microns, and most preferably between about 5 and 10 microns. Preferred glass frit materials include low melting temperature glasses such as lead silicates and zinc, lead, or phosphate glasses. These glasses are chosen to flow and sinter when heated. The cohesiveness of the frit containing material must be sufficient that the frit containing material retains the shape of the recessed pattern once it is deposited onto the glass. Consequently, the glass frit containing material is preferably solidified while still retained within the recessed pattern, so that the glass frit containing material retains the shape of the recessed pattern. In a preferred embodiment, at least some of the hardening or solidification of the glass frit containing material occurs during the transfer to the substrate. During the removal of the hardened frit structure from the intaglio pattern plate, as well as upon subsequent heating to pyrolyze organic constituents, the frit structure must retain its shape and any carbonaceous residue left preferably is minimal to avoid interference with frit consolidation. This can be achieved using thermoplastic (hot melt) materials, whereby hardening is achieved by cooling. Preferred thermoplastic materials include plasticized thermoplastic polybutylmethacrylate polymers blended with waxes, such as fatty alcohol waxes. Alternatively, the binder can be a blend of plasticized thermoplastic polymers with methacrylate or acrylate monomers. In the latter case, just sufficient methacrylate or acrylate monomer is employed to retain the shape upon transferring and in subsequent firing. The methacrylate monomers are preferred to minimize carbonaceous residue upon binder removal. The thermoplastic polymer is generally polybutylmethacrylate and the plasticizers can be selected from any commonly employed plasticizers such as dialkyl phthalates, alkyl alcohols, and so forth. During binder removal the plasticizers are selected to volatilize prior to pyrolysis of the cross-linked methacrylate network.

In one embodiment, a coating of glass frit containing material first deposited onto a substrate, after which this formable frit layer is embossed via contact with an intaglio plate. For example, one suitable frit for use in this embodiment is a glass frit dispersed with a thermoplastic organic material. The frit containing coating is heated if needed or desired to impart sufficient flowability to the frit containing material. Subsequently, the thermoplastic material is shaped via contact with the intaglio recessed pattern.

In an alternative embodiment, a glass frit which is dispersed within an organic carrier material is deposited within the recessed pattern. Then, while the carrier and frit materials are retained within the recessed pattern, the frit containing material is hardened, such as by drying, cooling, reacting (crosslinking, such as by thermal, photochemical (radiation cure) or other crosslinking means), or other means, depending on what organic carrier material is utilized. Hardening these materials while they are retained within the recessed pattern enables the materials to retain the shape of the recessed pattern as much as possible.

In one such embodiment, the frit containing material can be first hardened while retained within the intaglio pattern, and then transferred to a suitable substrate using an adhesive which is applied either to the substrate or the frit containing material. In such cases, the adhesive layer preferably is applied onto the surface of the substrate, and the hardened frit containing material is then contacted with the adhesive to transfer the frit containing material thereto. A number of methods can be employed as the transfer adhesive. For example, the transfer adhesive can be (1) a pressure sensitive adhesive preapplied to the glass as a transfer film or applied as a liquid with pressure sensitive adhesion subsequently developed by cooling, drying or reacting; (2) a molten liquid layer which solidifies by cooling upon contact with the intaglio plate; or (3) a liquid which reacts (cures) while in contact with the intaglio plate. In the latter case radiation curing is preferred. In all cases transfer occurs because cohesion and adhesion to the substrate by the transfer adhesive is greater than that of the frit filled organic material to the intaglio plate. A preferred material for the adhesive layer contains a radiation curable acrylate or methacrylate monomer, such as a radiation curable ethoxylated trimethylpropane triacrylate. Preferably, the adhesive layer contains sufficient radiation curable monomer so that it may be cured while receiving the cured frit containing material which makes up the pattern for the barrier ribs. Optionally, the transfer adhesive could be frit filled to facilitate the eventual frit adhesion to the substrate.

In another such embodiment, the glass frit containing material may be hardened simultaneous with transfer of the material to the suitable substrate using radiation curable or other curable materials. This can be achieved, for example, by employing radiation curable material as the carrier, and curing the material by emitting radiation through a glass substrate and into the carrier material while it is retained within the recessed pattern and during the deposition of the material to the substrate. The preferred radiation curable materials are the UV curable acrylate or methacrylate monomers, with the methacrylate being preferred. Again to minimize carbonaceous residue upon firing it is desirable to have a significant quantity of non-reactive thermoplastic acrylic resins, waxes, plasticizers, etc, the cross-linkable monomers being kept at a level just sufficient for retaining the shape upon transfer and firing.

After the frit containing material has been successfully deposited onto the substrate, the organic material is preferably burned out by heating the resulting composite to a temperature which is sufficient to volatilize or burn off any organic material and sinter the glass frit material. In the case of rib structures, after such a burn off step, the result is a monolithic structure consisting of a flat substrate with upstanding glass or ceramic rib structures thereon.

Using the methods of the present invention, applicants have successfully formed monolithic rib structures suitable for use as the back plate in plasma display applications. Compared to the prior art methods for forming glass ribs, the present invention is simpler and is thought to facilitate the formation of accurate freestanding glass rib structures. The present invention enables the formation of extremely accurate freestanding glass structures, for example, which are 10's of microns wide by 100's of microns high, thereby enabling vertical structure aspect ratios of 5 or more to 1, as well as structures as high as several millimeters. For example, ribs 40 microns wide by 200 microns high have been achieved, as well as ribs 300 microns wide and 1 mm high, although it is believed that ribs as high as 2 or 3 mm high and several hundred microns wide could be achieved.

DETAILED DESCRIPTION OF THE INVENTION

Figure 1:
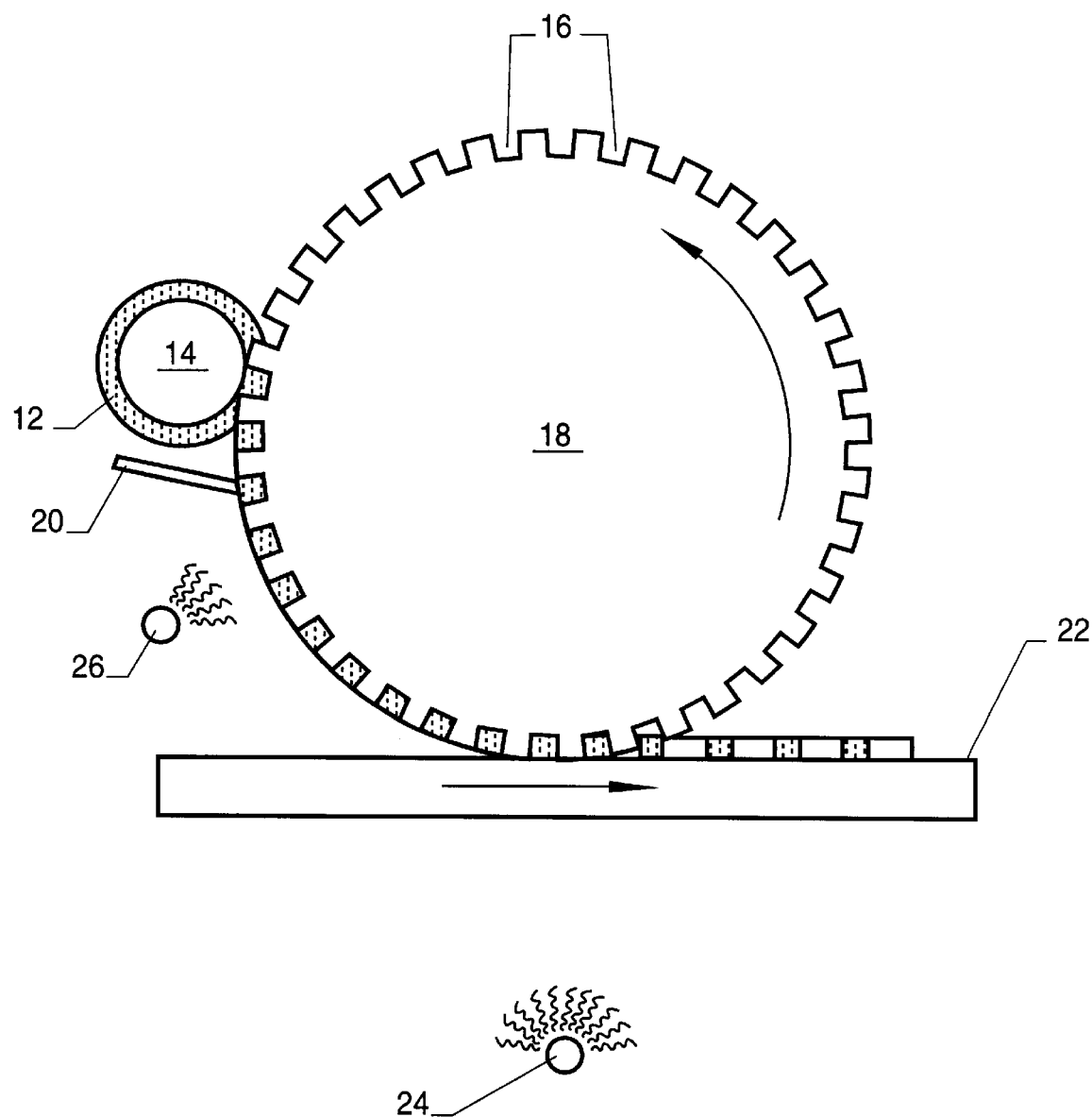
FIG. 1 illustrates an apparatus for depositing a barrier rib structure onto a glass substrate.

FIG. 1 illustrates deposition of a barrier rib layer for use in plasma display panels. In FIG. 1, frit containing material 12 is deposited from applicator roll 14 onto recessed surface 16 of intaglio roll 18. Alternatively, the frit containing material 12 could simply be doctored into the grooves 16. Recessed pattern 16 corresponds to a desired pattern for a barrier rib structure for a plasma display panel. After deposition into recessed pattern 16, excess glass frit containing material 12 is removed from the recess by doctor blade 20.

Preferred frit containing materials include low melting temperature glasses such as lead silicates and zinc, lead, or phosphate glasses. The frit containing materials may also be provided with a quantity of crystalline filler therein, e.g. a crystalline material selected from the group consisting of mineral, ceramic, or glass ceramic materials. Preferably, such crystalline materials should have a coefficient of thermal expansion and be employed in amount so that, over the temperature range of 0° to 300° C., the average or resultant coefficient of thermal expansion of the frit containing material is between about 32 to $50 \times 10^{-7}$/°C. for field emission or plasma addressed liquid crystal display applications, and about 77 to $90 \times 10^{-7}$/°C. for plasma display applications. More preferably, the coefficient of thermal expansion for the frit containing material is between about 35 to $45 \times 10^{-7}$/°C. for field emission or plasma addressed liquid crystal display applications, and between about 80 to $85 \times 10^{-7}$/°C. for plasma display applications over this temperature range.

In the present invention, such crystalline or glass inorganic materials are preferably employed in the frit containing mixtures at a level of at least 40 percent be weight inorganic frit, more preferably greater than 55 weight percent, and most preferably greater than 70 weight percent inorganic frit particles, the remainder being organic carrier, as will be described below.

In the embodiment illustrated in FIG. 1, the frit containing material 12 is deposited onto a suitable substrate 22, which preferably is a glass sheet. The frit material should preferably develop sufficient cohesiveness while retained within the recessed pattern 16 to retain the shape of the recessed pattern 16. Preferably, to facilitate this result, the glass frit containing material is hardened prior to or during deposition to the substrate 22. For example, in the most preferred embodiment, the carrier for the glass frit material is curable via UV radiation and the material 12 is cured via UV light 24 simultaneous with deposition of the frit containing material to the substrate 22. Substrate 22 is transparent to the UV radiation emitted by UV light 24, thereby allowing the radiation to travel through substrate 22 and cure the organic carrier for the glass frit containing material 12. Of course such radiation curing could be achieved by other means, e.g., by emitting radiation from a suitable radiation source (not shown) at the nip between roll 18 and the substrate 22.

Alternatively, hardening of the glass frit containing material 12 can be achieved utilizing thermoplastic carriers and cooling the carriers to set them within the recessed pattern 16. Consequently, when the curing or hardening of the glass frit containing material 12 is complete, the glass frit containing material 12 will retain the shape of recessed pattern 16 during and after transfer to the substrate.

In another embodiment, the glass frit containing material 12 is hardened or cured prior to being deposited to the substrate 22, such as, for example, by UV light 26. In such cases, prior to transfer of the frit containing material 12 to the substrate 22, it may be desirable to apply an adhesive layer either to the substrate or the glass frit containing material. The adhesive can be a tacky pressure sensitive adhesive which adheres to the substrate upon applying pressure, or it can be formulated to cure upon contact. In the later case, using a radiation curable adhesive is preferred. In all cases, it is often desirable that the adhesive layer also contain frit to facilitate adhesion retention upon binder removal and ultimate post-fired adhesion between the structures and the glass substrate. It may also be desirable that this frit be a lower melting frit to enhance post-fired adhesion. The adhesive used can be, for example, a material selected from the group consisting of polyimides, epoxides, acrylics, vinyl ethers, polyurethanes, polyesters, acrylated or methacrylated acrylics, esters, urethanes, and epoxides, or mixtures thereof. Plasticized polyalkylmethacrylate polymers are generally preferred due to advantages in binder removal. If a reactive adhesive is desired these are generally blended with polyfunctional methacrylate monomers, photoinitiators, and so forth.

The intaglio imaging surface should preferably be more releasing than the adhesive used to transfer the hardened glass frit containing material 12 to the glass substrate 24. Material disposed within intaglio and gravure imaging plates typically has a negative meniscus, the surface of the material in the recessed pattern curving below the imaging plate surface. Consequently, the adhesive layer must be sufficiently soft and tacky to contact and adhere to the cured or hardened glass frit containing material 12 and remove the material from the recesses of the intaglio imaging pattern.

The use of an adhesive may only be necessary where a negative meniscus results, such as is the case where the glass frit containing material is hardened by drying. The shrinkage for such materials is usually higher than for cured or cooled material shrinkage. However, if the intaglio groove is filled by means other than doctoring and if the material is not solidified by drying, it may be possible to avoid the negative meniscus and therefore transfer without needing the transfer adhesive. For example, ink can be deposited into the grooves by typography, a squeegee, roll coating orifice extrusion and so forth, so that the meniscus in the intaglio grooves could be positive, or alternatively so that a thin continuous film layer covers the surface of the intaglio pattern plate.

After the glass frit containing material has been transferred to the glass substrate 24, the substrate and frit containing material 12 are fired at a temperature sufficient to burn off any organic materials present, as well as to sinter of fuse the glass frit containing material 12, while still maintaining the structural integrity of the material. Using the methods described herein, dense, fully fused, homogeneous free-standing glass structures of high quality have been achieved which are suitable for use as barrier ribs in electronic display barrier rib applications.

Figure 2:
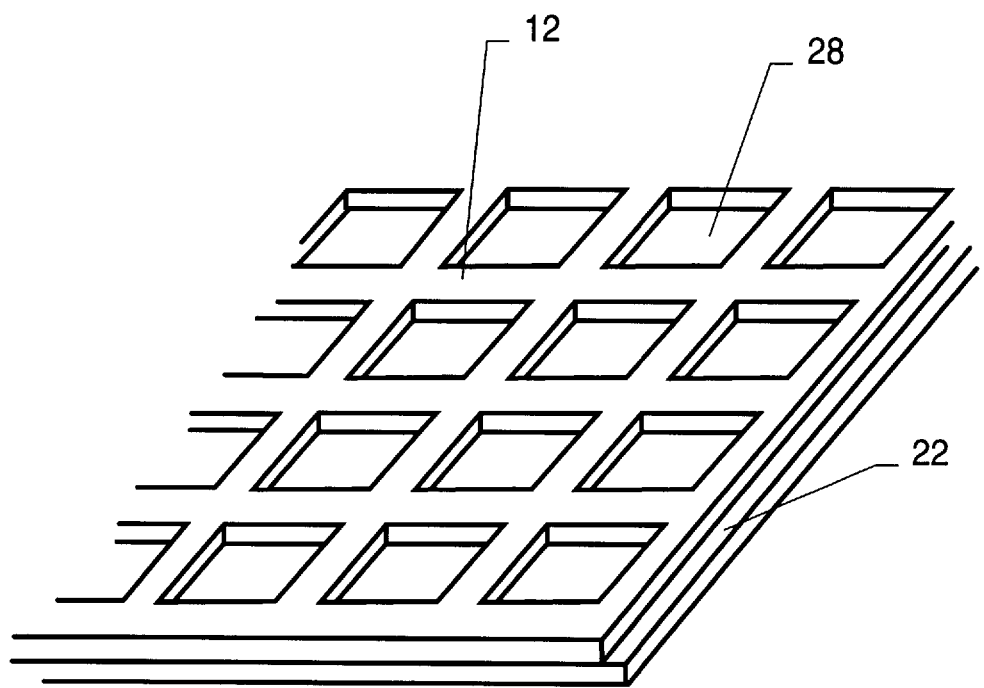
FIG. 2 illustrates a closed-cell barrier structure formed using the process illustrated in FIG. 1.
Figure 3:
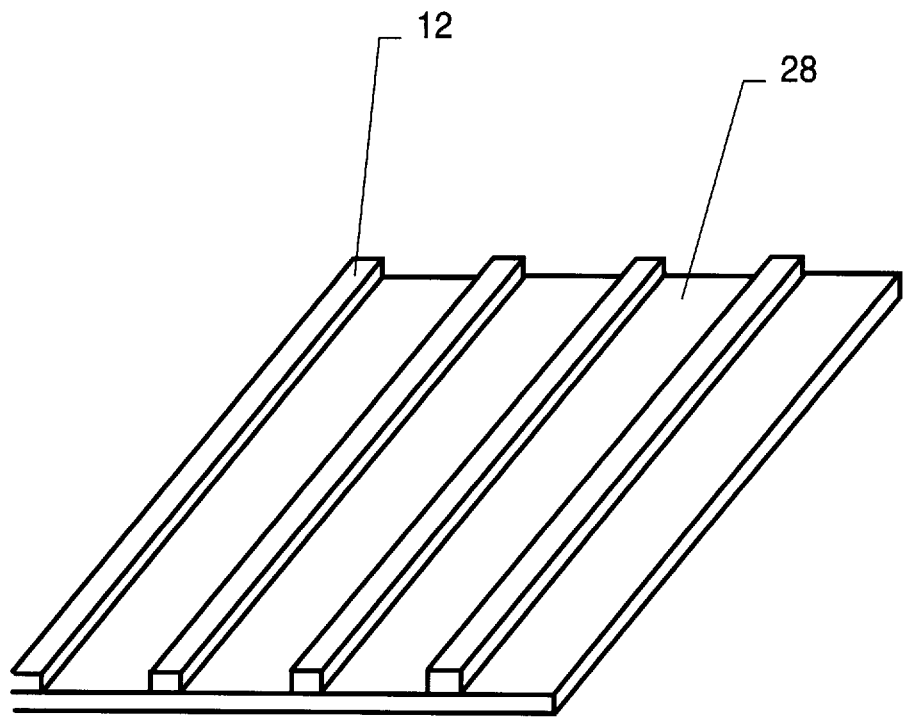
FIG. 3 illustrates an alternative barrier rib structure formed using the process illustrated in FIG. 1.

FIG. 2 illustrates a resultant structure formed by depositing glass frit containing material 12 onto substrate 22. The rib structure illustrated in FIG. 2 comprises criss-crossing ribs which form square recesses 28. Alternatively, rectangular row glass barrier ribs could be formed, as illustrated in FIG. 3, by employing parallel rows of recesses in recessed pattern 16, rather than criss-crossing rows of recesses. Thus, as used herein, barrier rib can mean criss-crossing ribs, parallel ribs, or any other types or shapes of barrier structures employed in the electronic display industry.

Figure 4:
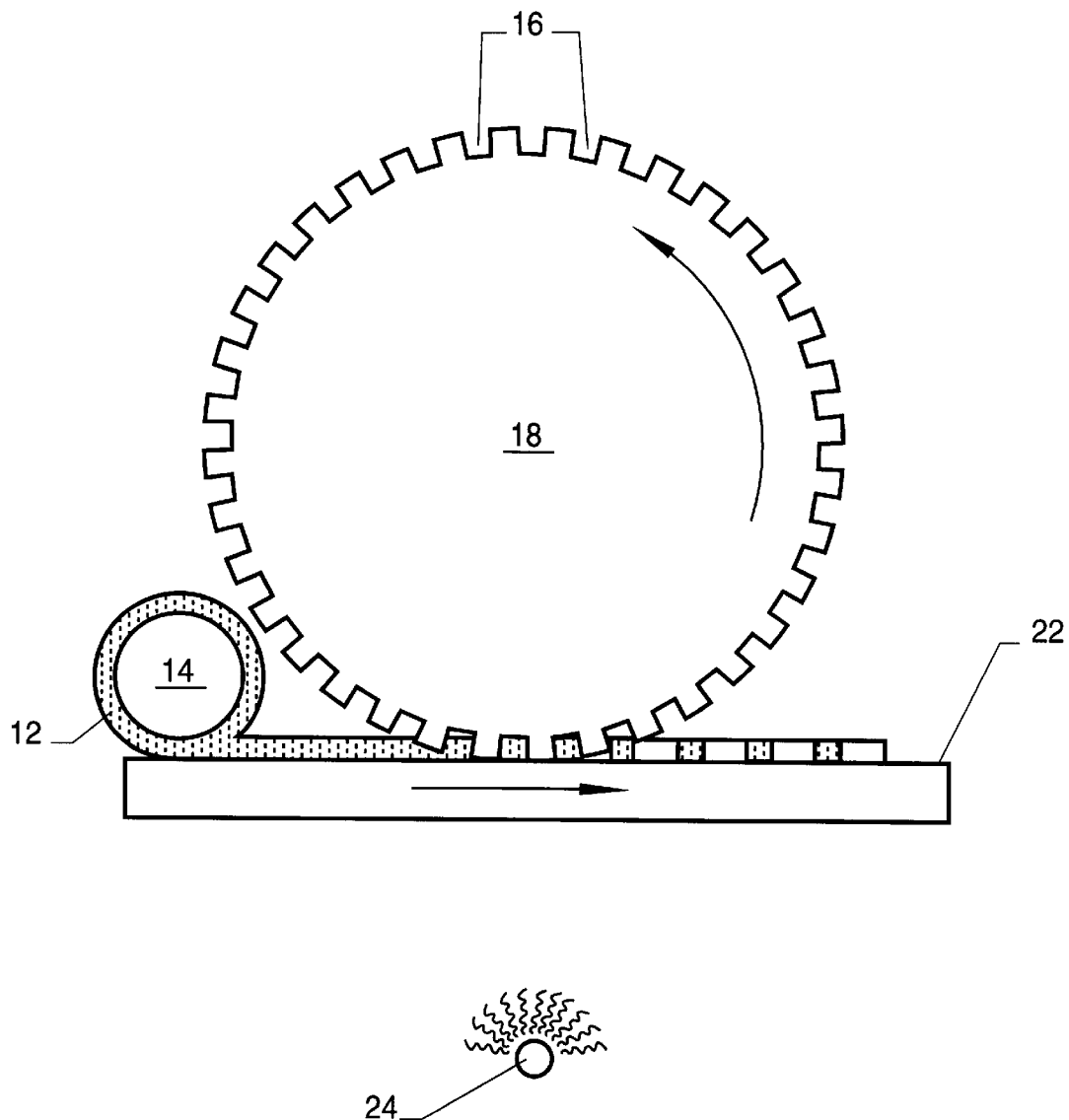

An alternative method in accordance with the invention is illustrated in FIG. 4. In this method, a coating or layer of frit containing material 12 is deposited from applicator roll 14 directly onto substrate 22. In the embodiment illustrated in FIG. 4, recessed pattern 16 corresponds to a desired pattern for a barrier rib structure for a plasma or field emission or plasma addressed liquid crystal display panel. The recessed surface 16 of Intaglio roll 18 contacts the frit containing material 12 and embosses it to form a free standing structure corresponding to the recessed pattern 16. If needed or desired, the frit coating material 12 may be heated prior to contact with roll 18, to impart sufficient flowability of the frit containing material. This may be achieved, for example via radiant heating, or via hot air being blown onto the layer prior to being contacted by the intaglio roll.

This method is particularly useful for forming a free standing structure such as barrier ribs utilizing thermoplastic frit containing materials. Thus, for example, applicator roll 14 can be employed to deposit a glass frit dispersed within a thermoplastic carrier material approximately 60 to 120 microns thick. In a preferred embodiment for making ribs 180 microns high having a pitch of about 200 microns, a glass frit dispersed within a thermoplastic organic carrier is deposited to a depth of about 60 microns prior to being contacted by the intaglio plate. This frit can then be heated prior to being contacted by Intaglio roll 18, to impart sufficient flowability to the glass frit so that it retains the shape of recessed pattern 16 after being contacted by the Intaglio roll 18.

The organic carrier for the frit containing material 12 may consist of, for example, a wax, a binder in solvent, a binder in wax, a binder in plasticizer, which may further contain a radiation curable oligomer or monomer. In general, if thick structures over 20 microns are desired, and the organic binder is to be removed by pyrolysis, thermoplastic binders in solvent, wax or plasticizer are preferably employed as these organics are more readily pyrolyzed without excessive carbon formation.

In another embodiment, however, radiation curable binder materials are employed. The most preferred of these radiation curable containing materials are "hybrid" materials, that is, a hybrid of an UV curable formulation and a thermoplastic formulation system. This hybrid binder system has properties which allow it to be deposited (e.g., printed in a pattern) similar to standard plasticized thermoplastic binder systems. As it contains a significant quantity of UV curable monomers, the hybrid binder has a "controlled fast set" characteristic, with the "fast set" achieved by exposing the material to an appropriately selected UV light source. Until exposed to the UV light, the UV curable monomers behave as a plasticizer, with no significant changes in rheology or other properties over time.

Through proper selection of the thermoplastic resin and the UV curable monomers in such hybrids, and formulating to an appropriate ratio of these components to achieve a low to moderate crosslink density, the binder system can have "burnout" properties equal to thermoplastic binder systems. Investigation of these hybrid systems has found that excellent "burnout" performance can be achieved using systems that have an acrylic resin such as poly(butyl methacrylate) and difunctional UV curable monomers which are methacrylate functional. However, it is contemplated that for other applications with different requirements for "burnout" or other properties, many other types of thermoplastic resins could be utilized. These include other acrylic resins, polyvinyl butyral, cellulosic resins, polyethyleneglycol, polypropyleneglycol, and polyalkylene carbonate. It is also contemplated that for certain applications, adequate binder formulations could be developed using UV curable monomers that are acrylate functional and/or mono- or polyfunctional. One preferred UV curable carrier material has the following composition (in parts by weight):

| | material | Function |
|---|---|---|
| 100 | polybutylmethacrylate | polymer binder |
| 60 | triethylene glycol di-2-ethylhexoate | plasticizer |
| 60 | tetraethylene glycol dimethacrylate | radiation curable monomer |
| 3 | Irgocure 369 | photoinitiator |
| 1 | isopropyl thioxanthone | sensitizer |

Irgocure 369, a product manufactured by Ceiba-Geigy, is 2-benzyl-2-dimethylamino-1-(4-morpholinothenyl)-butan-1-one.

The intaglio image plate 18 may be formed, for example, from a material of moderate release, such as Halar, Tedlar, Tefzel, polyethylene, etc. Alternatively, it may be comprised of one of a number of materials noted for high release, such as silicones or fluorocarbons. The desire is to make the adhesion between the frit containing material and the patterned plate less than between the frit-containing material of the substrate and/or adhesive. The intaglio image can be formed using many techniques, such as manufacturing the plate from one of these materials or coated them thereon. One example is embossing by heating one of the above materials at a temperature above the flow point of the polymer and applying the material under pressure against a rigid master mold pattern. The intaglio surface could alternatively be an etched metal, foil or sheet of glass on which a release coat was applied. The embossed polymer layer is preferably backed with an elastomeric material to impart compressibility.

The invention is further illustrated by the following examples, which are meant to be illustrative, and not limiting.

EXAMPLES

The objective of the following example was to obtain 50 by 200 micron glass ribs which are suitable for use in a plasma display device. To make the mold, a flat intaglio master mold was made, having 50 by 200 micron by 5 cm ribs thereon, separated by a distance of about 200 microns. The master mold, which was glass, was made by mechanical machining techniques. A flat silicone mold was then made by pouring silicone material (RTV 141) over the glass master and then curing the silicone material. This resulted in a flexible silicone mold having 50 by 200 micron recesses therein. The mold employed in the examples was made of silicone to facilitate removal of the glass frit containing material therefrom.

Example 1

This example illustrates the use of thermoplastic materials to form barrier ribs. The thermoplastic glass frit containing material employed was Degussa Enamel No. PR 112/809863. This frit containing material has 75 percent glass frit material, the remainder being Cerdec MX4462 wax, manufactured by Cerdec France, S. A.

The thermoplastic enamel was doctored onto the silicone mold and then transferred onto a glass substrate. Successful transfer of the frit containing material from the recessed pattern 16 to the glass substrate was achieved by first heating the enamel and mold, while the enamel was retained within the silicone mold, to a temperature of about 70° C.–120° C. Then, while maintaining the substrate at room temperature, the heated mold was contacted with the substrate and the mold was cooled. The frit containing material was in this manner successfully transferred to the glass within several seconds, forming about 250 glass frit containing ribs, each rib being about 50 microns wide by 200 microns high by 5 cm long, the ribs being separated by a distance of about 250 microns.

The structure was then fired to burn off organic constituents. Prior to firing, a thick layer of alumina powder (0.5 $\mu$m particle size) was deposited on top of and in between the ribs prior to sintering, to help separate and maintain the dimensions of the ribs during the firing process. The structure was fired at the following thermal cycle to burn off the organic constituents:

2 hours ramp up from 20° C. to 430° C.

2 hours ramp up from 430° C. to 620° C.

30 minute hold at 620° C.

40 minute ramp down from 620° C. to 400° C.

slow temperature decrease to room temperature

After the thermal cycle, the alumina powder was removed by washing in water. The resultant monolithic inorganic structure consisted of a flat glass sheet with 50 by 200 micron by 5 cm black glass ribs thereon. The dimensional quality of these ribs was sufficient for use as a back plate in a plasma display.

The need for the alumina powder can be avoided by formulating the binder such that sufficient material can be volatilized during the binder removal step before reflow can occur, for example, by blending volatile waxes such as fatty alcohols with higher melting waxes or using thermoplastic polymers that form thermally reversible gels. It is also desirable that the loading of frit be as close to the CPVC (Critical Powdered Volume Concentration) as practical such that only a small amount of binder need be removed before reflow will no longer occur.

Example 2

The same procedure as Example 1 was followed, with the exception that the enamel employed was Degussa Enamel No. MX 4462/531063/1. This frit containing material has 85 percent inorganic material. Following the procedure outlined in Example 1, the resultant monolithic glass structure consisted of a flat glass sheet with 50 by 200 micron by 5 cm long clear transparent glass ribs thereon. The dimensional and optical quality of these ribs was sufficient for use as a back plate in a conventional plasma display.

Example 3

This example illustrates the use of UV curable methacrylate resins to form barrier ribs. The resin used was a thermoplastic resin having methacrylate functional monomers therein to provide crosslinking. The resin had a viscosity of 54,400 mPa·s at 25° C. and contains photoinitiators which should allow for an adequate cure by exposure to 2 J/cm$^2$ using a Fusion Systems D lamp. The frit containing material was a mixture of 2 parts of a phosphate glass frit to 1 part resin, by weight.

The frit filled resin was doctored into the silicone mold and then transferred onto a glass substrate. Successful transfer of the paste from the recessed pattern 16 to the glass substrate was achieved by four successive exposures (through the glass), with 90 degree rotations between exposures, to a Fusion Systems H lamp. The mold was then peeled away leaving structural ribs measuring 50 microns wide by 200 microns high, with the distance between the ribs being about 250 microns.

The structure was then fired to burn off the organic constituents using the following thermal cycle:

Ramp up from 20° C. to 500° C. at a rate of 300° C. per hour

Soak at 500° C. for 1 hour

Ramp down from 500° C. to 20° C. at a rate of 300° C. per hour.

The resultant structure consisted of a flat glass sheet with 50 by 200 micron ribs. The dimensional quality of these ribs was sufficient for use as a barrier rib back plate structure for a plasma display.

Example 4

This example illustrates the use of thermoplastic materials to form barrier ribs, using the method illustrated in FIG. 4. The thermoplastic glass frit containing material employed was a mixture of Cerdec MX4462 wax, manufactured by Cerdec France, S. A. The Cerdec MX4462 wax is desirable because of its relatively sharp phase transition at about 53° C. from solid to liquid. The glass frit employed was Cerdec VR725 frit, a glass frit high in PbO and $SiO_2$, which is available from Cerdec France, S. A., and has a frit particle size which is primarily between about 1–10 microns, the average particle size being about 5 microns in diameter. A mixture of this glass frit (eighty percent by weight glass frit) was dispersed within the wax, and the resultant glass frit containing material was coated at about 70° C. (the material was heated via radiant heat prior to coating) onto a glass substrate to form a coating about 120 microns thick on the glass substrate. The glass frit containing coating was then molded into the desired glass rib structure by contacting the coating with cylindrical drum having a recessed intaglio patterned similar to the silicone mold described above in other examples. The intaglio pattern corresponded to a desired glass rib structure which was similar in appearance to that illustrated in FIG. 3. Just prior to being contacted by the drum, the frit containing coating was heated by blowing hot air (approximately 70°–90° C.) to transform the glass frit containing material into a flowable coating. The glass substrate was then contacted with the drum, moving at a rate of about 3–5 meters/min with respect to the drum as it was contacted. The result was a rib structure similar to that illustrated in FIG. 3, having about 250 glass frit containing ribs, each rib being about 50 microns wide by 200 microns high by 5 cm long, the ribs being separated by a distance of about 220 microns.

This rib structure was then fired to remove the organic constituents. Prior to firing, the rib structure was sprayed with a solution containing Natrosol 250HHBR, a cellulosic compound available from Hercules B. V. of The Netherlands, the active ingredient of which is hydroxyethyl cellulose. The solution was a mixture of 0.5 weight percent Natrosol 250HHBR added to a 50:50 solution of water and ethanol. The ribs were sprayed with this cellulosic solution to a depth which completely filled the spaces between the ribs, and allowed to dry at room temperature. Coating the ribs in this manner prevents flow of the frit during firing and thereby substantially maintains the shape of the ribs during firing. During the firing treatment, we have found that this solution will volatilize completely, but apparently not until the ribs have completely consolidated into a homogeneous glass rib structure. A surfactant may also be added if desired to facilitate coverage and uniform aeration of the spray.

The firing schedule employed was as follows:

the ribs were placed directly into an oven which had been preheated to about 250° C.

1 hour ramp up from 250° C. to 350° C.

¼ hour hold at 350° C.

1 hour ramp up from 350° C. to 550° C.

10 minute hold at 550° C.

2 hour ramp down to room temperature.

The rib structure maintained substantially the same dimensions and shape as was present prior to the firing, each rib being about 50 microns wide by about 170 microns high by 5 cm long, the ribs being separated by a distance of about 220 microns. It is not uncommon for ribs formed in this manner to exhibit a very small degree of shrinkage and/or slumping. Thus, for example, the ribs described above may shrink slightly in height, and may become slightly wider at their base than the remainder of their height. However, this change in dimensions is relatively insignificant, and ribs formed above are entirely suitable for use in electronic display applications. Further, this may be improved upon by initially forming the ribs to be slightly larger so that, after firing, they shrink to the desired dimensions.

Although the invention has been described in detail for the purpose of illustration, it is understood that such detail with solely for that purpose and variations can be made therein by those skilled in the art without departing from the spirit and scope of the invention which is defined by the following claims. For example, while FIG. 1 illustrates an imaging roll, alternatively a flat imaging plate could be employed.

What is claimed is:

1. A method of making free standing dielectric glass structures, comprising:

contacting a formable glass, ceramic, or glass-ceramic frit containing dielectric material with an intaglio recessed pattern to thereby form said frit containing material into a shape of a desired free-standing structure having a thickness greater than 20 microns, and hardening said frit containing material sufficiently to retain said shape.

2. The method of claim 1, wherein said contacting step comprises:

filling said recessed pattern with said glass, ceramic, or glass-ceramic frit containing material; and transferring the frit containing dielectric material to a substrate, said frit containing dielectric material retaining the shape of the recessed pattern to form a free standing structure on said substrate.

3. The method of claim 2, wherein said contacting step comprises sufficiently hardening at least a portion of the frit containing dielectric material while said frit containing material is retained within said recessed pattern to facilitate said frit containing material retaining the shape of said recessed pattern.

4. A method of making free standing glass structures, comprising:

depositing a coating of a formable glass, ceramic, or glass-ceramic frit containing material onto a substrate and contacting said coating on said substrate with an intaglio recessed pattern to thereby form said frit containing material into a shape of a desired free standing structure, and hardening said frit containing material sufficiently to retain said shape.

5. The method of claim 4, wherein said frit containing dielectric material comprises a thermoplastic organic carrier, and prior to said contacting, said coating is heated to facilitate forming of said frit containing material.

6. The method of claim 1, wherein said frit containing dielectric material further comprises a crystalline filler therein, and the average coefficient of thermal expansion of the frit containing material is about $35–45 \times 10^{-7}/°C$. over the temperature range of 0° to 300° C.

7. The method of claim 1, wherein said frit containing material comprises a crystalline filler therein, and the average coefficient of thermal expansion of the frit containing material is about $80–85 \times 10^{-7}/°C$. over the temperature range of 0° to 300° C.

8. The method of claim 1, wherein said frit comprises a glass frit having a softening point less than about 500° C.

9. The method of claim 1, wherein said frit comprises a glass frit selected from the group consisting of phosphate, lead, and zinc based glasses.

10. The method of claim 2, wherein said frit containing dielectric material comprises at least 55 percent of a glass, ceramic, glass-ceramic or other inorganic material dispersed within an organic carrier material.

11. The method of claim 10, wherein said organic material is hardenable via radiation curing, drying, or heat.

12. The method of claim 10, wherein said organic material is curable material, and said transferring step comprises curing said organic material.

13. The method of claim 10, wherein said organic material is radiation curable, and said transferring step comprises emitting radiation through said substrate to cure said frit containing dielectric material simultaneous with said transferring step.

14. The method of claim 1, further comprising firing said formed frit containing material and said substrate at a temperature which is sufficient to fuse said frit.

15. The method of claim 14, further comprising, prior to said firing step, applying a material between said freestanding structures to facilitate said freestanding structures retaining their shape during said firing step.

16. The method of claim 15, wherein said firing step comprises firing said frit containing material and said substrate at a temperature between about 100° and 600° C.

17. The method of claim 1, further comprising transferring said free standing structures directly to a substrate to form free standing glass structures rigidly bonded to said substrate.

18. The method of claim 17, wherein said hardening of said glass frit containing material occurs while said material is retained within said recessed pattern.

19. The method of claim 18, further comprising, prior to said transferring step, applying an adhesive layer either to said substrate or said hardened glass frit containing material.

20. A method of making a glass barrier rib plate for a flat panel display, comprising:

contacting a formable glass, ceramic, or glass-ceramic frit containing material with an intaglio recessed pattern to thereby form said frit containing material into a shape of a desired barrier rib, and hardening said frit containing material sufficiently to retain said shape.

21. The method of claim 20, wherein said contacting step comprises:

filling said recessed pattern with said glass, ceramic or glass-ceramic frit containing material; and transferring the frit containing material to a substrate, said frit containing material retaining the shape of the recessed pattern to form a barrier rib on said substrate.

22. The method of claim 21, wherein said contacting step comprises sufficiently hardening at least a portion of the frit containing material while said frit containing material is retained within said recessed pattern to facilitate said frit containing material retaining the shape of said recessed pattern.

23. A method of making a glass barrier rib plate for a flat panel display, comprising:

depositing a coating of a formable glass, ceramic, or glass-ceramic frit containing material onto a substrate and contacting said coating on said substrate with an intaglio recessed pattern to thereby form said frit containing material into a shape of a desired barrier rib, and hardening said frit containing material sufficiently to retain said shape.

24. The method of claim 23, wherein said frit containing material comprises a thermoplastic organic carrier, and prior to said contacting, said coating is heated to facilitate forming of said frit containing material.

25. The method of claim 10, wherein said organic carrier material in said contacting step comprises a mixture of radiation curable and thermoplastic ingredients.

26. The method of claim 15, wherein said material applied between said freestanding structures comprises a cellulosic material.

27. The method of claim 4, wherein said frit containing material comprises an organic material that is hardenable via radiation curing, and said hardening step comprises emitting radiation through said substrate to cure said frit containing material simultaneous with said contacting step.

28. The method of claim 23, wherein said frit containing material comprises an organic material that is hardenable via radiation curing, and said hardening step comprises emitting radiation through said substrate to cure said frit containing material simultaneous with said contacting step.

\* \* \* \* \*